(12) United States Patent
Shabany

(10) Patent No.: US 9,182,177 B2
(45) Date of Patent: Nov. 10, 2015

(54) HEAT TRANSFER SYSTEM WITH INTEGRATED EVAPORATOR AND CONDENSER

(75) Inventor: Younes Shabany, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 13/548,001

(22) Filed: Jul. 12, 2012

(65) Prior Publication Data

US 2013/0042636 A1 Feb. 21, 2013

Related U.S. Application Data

(60) Provisional application No. 61/506,924, filed on Jul. 12, 2011.

(51) Int. Cl.
| | |
|---|---|
| F28F 27/00 | (2006.01) |
| F25D 15/00 | (2006.01) |
| F28D 15/02 | (2006.01) |
| H01L 23/427 | (2006.01) |
| F28D 15/06 | (2006.01) |
| F28D 21/00 | (2006.01) |

(52) U.S. Cl.
CPC ........ F28D 15/0233 (2013.01); F28D 15/0266 (2013.01); F28D 15/06 (2013.01); H01L 23/427 (2013.01); F28D 2021/0028 (2013.01); H01L 2924/0002 (2013.01)

(58) Field of Classification Search
CPC . F28D 15/02; F28D 15/0266; F28D 15/0275; F28D 15/06; H01L 23/427
USPC ................ 62/119, 259.2; 165/80.4, 165/104.33–104.34, 104.26, 104.21, 185, 165/274; 361/679.52, 700, 679.54, 704, 361/709–710
See application file for complete search history.

(56) References Cited

U.S. PATENT DOCUMENTS

| | | | |
|---|---|---|---|
| 4,069,497 | A | 1/1978 | Steiditz |
| 4,712,160 | A | 12/1987 | Sato et al. |
| 4,899,256 | A | 2/1990 | Sway-Tin |
| 5,101,322 | A | 3/1992 | Ghaem et al. |
| 5,235,491 | A | 8/1993 | Weiss |
| 5,272,599 | A | 12/1993 | Koenen |
| 5,295,044 | A | 3/1994 | Araki et al. |
| 5,355,942 | A * | 10/1994 | Conte ...................... 165/104.33 |
| 5,365,403 | A | 11/1994 | Vinciarelli et al. |
| 5,427,174 | A * | 6/1995 | Lomolino et al. ....... 165/104.13 |
| 5,838,554 | A | 11/1998 | Lanni |
| 5,920,458 | A | 7/1999 | Azar |

(Continued)

FOREIGN PATENT DOCUMENTS

| | | |
|---|---|---|
| JP | 2005291645 | 10/2005 |
| JP | 2009105156 | 5/2009 |

*Primary Examiner* — Mohammad M Ali
*Assistant Examiner* — Steve Tanenbaum
(74) *Attorney, Agent, or Firm* — Haverstock & Owens LLP

(57) ABSTRACT

Two phase heat transfer systems including integrated fluid transfer paths for exchange of a working fluid between an evaporator and condenser. Separate fluid transfer paths may be defined for communication of working fluid between the evaporator and condenser, wherein at least one of the fluid transfer paths is integrated with the evaporator and/or condenser. In one embodiment, both first and second fluid transfer paths are integrally provided to establish direct fluid communication between the evaporator and condenser to facilitate flow of vaporized and condensed working fluid respectively.

16 Claims, 5 Drawing Sheets

(56) References Cited

U.S. PATENT DOCUMENTS

| | | |
|---|---|---|
| 5,933,324 A | 8/1999 | Barrett |
| 6,243,269 B1 | 6/2001 | Dibene, II et al. |
| 6,272,015 B1 | 8/2001 | Mangtani |
| 6,282,092 B1 | 8/2001 | Okamoto et al. |
| 6,369,328 B1 | 4/2002 | Munakata |
| 6,549,409 B1 | 4/2003 | Saxelby et al. |
| 6,708,515 B2 * | 3/2004 | Malone et al. ............... 62/259.2 |
| 6,714,413 B1 * | 3/2004 | Ghosh et al. .................. 361/700 |
| 6,775,162 B2 | 8/2004 | Mihai et al. |
| 6,795,315 B1 | 9/2004 | Wu et al. |
| 6,889,756 B1 * | 5/2005 | Hou .......................... 165/104.33 |
| 7,011,146 B2 | 3/2006 | Wong |
| 7,208,833 B2 | 4/2007 | Nobori et al. |
| 2001/0045297 A1 | 11/2001 | Miller et al. |
| 2002/0008963 A1 | 1/2002 | DiBene, II et al. |
| 2002/0092160 A1 | 7/2002 | McCullough |
| 2003/0205363 A1 * | 11/2003 | Chu et al. ..................... 165/80.3 |
| 2004/0122606 A1 | 6/2004 | Cohen et al. |
| 2004/0144527 A1 | 7/2004 | Yang et al. |
| 2006/0117764 A1 * | 6/2006 | Patel et al. ...................... 62/121 |
| 2006/0196642 A1 | 9/2006 | Gharib |

\* cited by examiner

HEAT TRANSFER SYSTEM WITH INTEGRATED EVAPORATOR AND CONDENSER

CROSS-REFERENCE TO RELATED APPLICATION

This application is a non-provisional of U.S. Patent Provisional Application No. 61/506,924, entitled: "HEAT TRANSFER SYSTEM WITH INTEGRATED EVAPORATOR AND CONDENSER" filed on Jul. 12, 2011. The contents of the above application are incorporated by reference herein as if set forth in full.

BACKGROUND

Many electronic devices (e.g., including electronic circuitry) generate heat during operation. Heat generated by electronic devices is preferably dissipated so as to improve reliability and reduce the potential for premature failure of the electronic devices. In some instances, the amount of heat generated by an electronic device may be such that cooling of the device by a heat transfer system is necessary to prevent overheating.

One proposed approach for dissipating heat generated by electronic devices is the use of a two-phase heat transfer system. In a two-phase heat transfer system, an evaporator may receive heat from an electronic device resulting in the heating of a fluid contained by the evaporator. In this regard, the fluid may undergo a phase change (e.g., the fluid may be vaporized from a liquid to a vapor). In turn, the evaporator may be connected to a condenser by way of a pipe or other plumbing extending between the evaporator and the condenser. Once the vaporized fluid enters the condenser, heat may be transferred from the fluid to the environment by way of the condenser such that the fluid condenses into a liquid in the condenser. In this regard, the condensed fluid in the liquid phase may be returned to the evaporator by the pipe extending between the condenser and the evaporator. Accordingly, the liquid phase fluid may again be heated in the evaporator and the cycle may repeat.

Two-phase heat transfer system may be beneficial because the amount of thermal energy (i.e., heat) associated with latent energy of a phase change is greater than a sensible heat of the fluid alone. That is, when a material undergoes a phase change the latent heat associated with the phase change of the material is absorbed or released in addition to the sensible heat associated with the change in temperature of the material in a single phase. Thus, a fluid that is transported after undergoing a change in phase may include significantly more energy than a fluid that has undergone sensible heating alone. It may often be the case that the latent heat associated with the phase change is much greater than the sensible heat that may be absorbed by the material.

Some two-phase heat transfer systems employ a pump or compressor to move the fluid through the cycle. It has also been proposed that capillary force, a pressure drop, or gravitational forces may be used to move the fluid through the cycle in a two-phase heat transfer system. In this regard, traditional two-phase heat transfer systems may be susceptible to a plurality of failure modalities that may negatively impact the reliability of the heat transfer system. For example, in the case of a two-phase heat transfer system that relies on a pump or the like to move fluid through the system, failure of the pump may render the system inoperable. Furthermore, the use of pipes or other plumbing to direct the fluid in the system (e.g., as in the case of a loop heat pipe) may be susceptible to failure, thus resulting in leaks and/or the reduction in fluid flow in the system. In any regard, the effectiveness of the system may be reduced or the system may undergo complete failure, which may result in undesirable excessive heating of the electronic device cooled by the heat transfer system.

SUMMARY

A first aspect includes a heat transfer system. The system includes an evaporator thermally engageable with a heat source and including a working fluid. The system also includes a condenser in fluid communication with the evaporator to receive vaporized working fluid from the evaporator. As such, a first fluid transfer path is provided extending from the evaporator to the condenser for movement of the vaporized working fluid from the evaporator to the condenser. Additionally, the system includes a second fluid transfer path extending from the condenser to the evaporator for movement of condensed working fluid from the condenser to the evaporator, wherein the second fluid transfer path is separate from the first fluid transfer path. Additionally, at least one of the first fluid transfer path or the second fluid transfer path is integrally defined by the evaporator or condenser.

A number of feature refinements and additional features are applicable to the first aspect. These feature refinements and additional features may be used individually or in any combination. As such, each of the following features that will be discussed may be, but are not required to be, used with any other feature or combination of features of the first aspect.

For example, in one embodiment, the evaporator may be in direct fluid communication with the condenser via the first fluid transfer path integrally defined by at least one of the evaporator or the condenser. Additionally or alternatively, the condenser may be in direct fluid communication with the evaporator via the second fluid transfer path integrally defined by at least one of the condenser and the evaporator.

The heat transfer system may also include an electronic component in thermal communication with the evaporator, wherein the electronic component generates heat in response to operation of the electronic component and comprises the heat source. In one embodiment, the electronic component may be a light emitting diode (LED) array.

In an embodiment, a fluid passage may extend between the first fluid transfer path and the second fluid transfer path. The fluid passage may extend through the condenser. The fluid passage may extend laterally beyond a lateral spatial extent of the evaporator. As such, flow of the working fluid through the fluid passage may include mass flow of the working fluid laterally beyond the lateral spatial extent of the evaporator. An internal surface area of the fluid passage may be at least about twice as large an internal surface area of the evaporator.

In another embodiment, a flow control may establish an operational fluid flow of the working fluid from the first fluid transfer path, through the fluid passage, and to the second fluid transfer path, in that order. As such, flow in a direction opposite the operational fluid flow may be limited by the flow control.

In various embodiments, the working fluid may be water, alcohol, or ammonia. Additionally, the evaporator and the condenser may be integrally constructed from a single portion of material. For example, the material may be aluminum or copper.

A second aspect includes a method for heat transfer. The method includes absorbing thermal energy at a working fluid disposed at an evaporator, vaporizing the working fluid, and first transporting the vaporized working fluid to a condenser via a first fluid transfer path extending from the evaporator to the condenser. The method further includes releasing thermal energy from the working fluid at the condenser, condensing the working fluid, and second transporting the condensed working fluid to the evaporator via a second fluid transfer path extending from the condenser to the evaporator. The second fluid transfer path is separate from the first fluid transfer path, and at least one of the first transfer path or the second transfer path is integrally defined by the evaporator or condenser.

A number of feature refinements and additional features are applicable to the second aspect. These feature refinements and additional features may be used individually or in any combination. As such, each of the following features that will be discussed may be, but are not required to be, used with any other feature or combination of features of the second aspect.

In one embodiment, the method may further include moving the working fluid through a fluid passage extending between the first fluid transfer path and the second fluid transfer path. The fluid passage may extend through the condenser. In one embodiment, the moving may includes mass flow of the working fluid beyond the lateral spatial extent of the evaporator.

The method may further include operating an electronic component to generate the thermal energy.

A third aspect includes a system for cooling an electronic device. The system includes an electronic device operable to generate heat upon operation of the electronic device. The system also includes an evaporator provided in thermal communication with the electronic device. The evaporator includes working fluid operable to absorb thermal energy transferred thereto from the electronic device. A condenser is provided that is in fluid communication with the evaporator and operable to receive vaporized working fluid from the evaporator. The working fluid is vaporized as a result of the absorbing of thermal energy from the electronic device. A first fluid transfer path extends from the evaporator to the condenser for movement of the vaporized working fluid from the evaporator to the condenser, and a second fluid transfer path extends from the condenser to the evaporator for movement of condensed working fluid from the condenser to the evaporator. The working fluid is condensed as a result of transfer of thermal energy from the working fluid to the condenser. The first fluid transfer path is separate from the second fluid transfer path, and at least one of the first fluid transfer path or the second fluid transfer path is integrally defined by the evaporator or condenser.

A number of feature refinements and additional features are applicable to the third aspect. These feature refinements and additional features may be used individually or in any combination. As such, each of the following features that will be discussed may be, but are not required to be, used with any other feature or combination of features of the third aspect.

For example, the system may further comprise a fluid passage extending between the first fluid transfer path and the second fluid transfer path. The fluid passage may at least in part extend laterally beyond a lateral spatial extent of the evaporator. The system may further include a flow control for directing working fluid from the first fluid transfer path, through the fluid passage, and to the second fluid transfer path, in that order.

DETAILED DESCRIPTION

Figure 1:
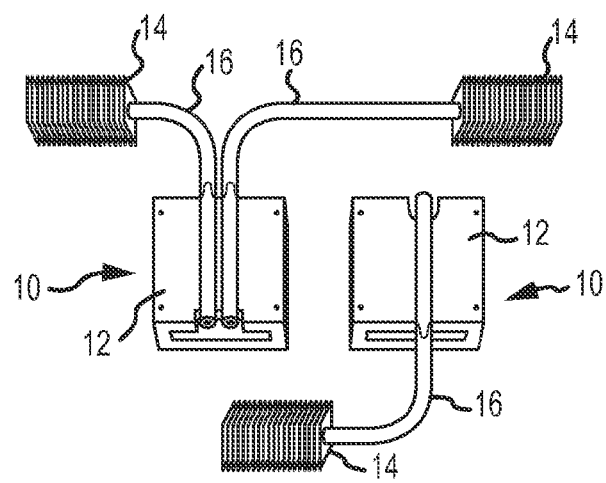
FIG. 1 depicts examples of heat pipes from the prior art.

While the invention is susceptible to various modifications and alternate forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope of the invention as defined by the claims.

FIG. 1 depicts examples of prior art heat pipes 10. As may be appreciated from FIG. 1, the heat pipes 10 generally include an evaporator 12 and one or more condensers 14 disposed at an end of a pipe 16 opposite from the evaporator 12. In this regard, the pipe 16 may facilitate transfer of fluid between the evaporator 12 and condenser 14. Accordingly, the pipe 16 may also present failure modalities that may adversely affect the reliability of the heat pipe 10 as discussed above (e.g., the pipe 16 may be susceptible to failure such as rupture or leakage).

Figure 2:
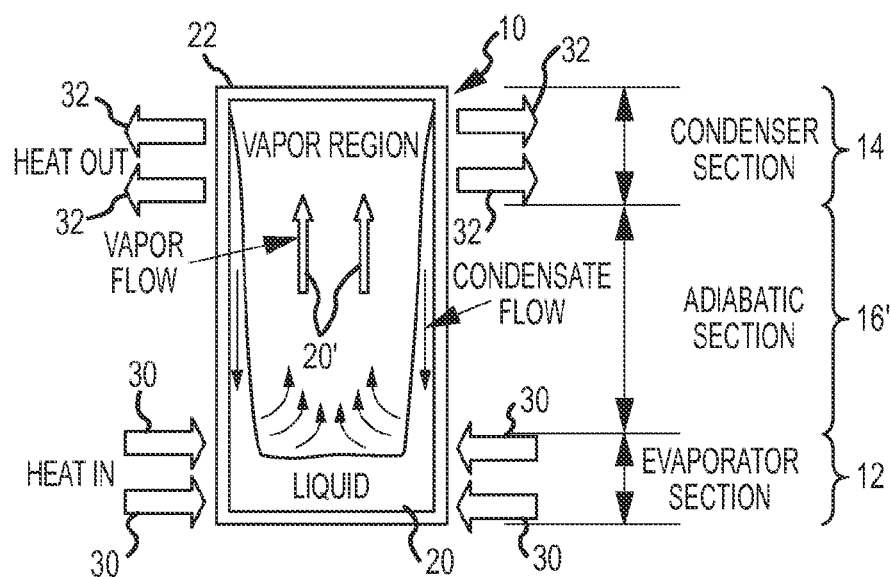
FIG. 2 is a schematic view depicting the operation of a thermosyphon.

FIG. 2 schematically depicts the operation of a heat pipe 10. In the heat pipe 10, a working fluid 20 is disposed within a housing 22. A portion of the housing is exposed to a heat source such that thermal energy (i.e., heat 30 represented by arrows in FIG. 2) is transferred to one end of the housing 22. The working fluid 20 may be in a liquid phase adjacent to where the heat 30 is received via the housing 22. This portion of the housing 22 may be referred to as the evaporator 12. Upon receipt of sufficient heat 30, the working fluid 20 may be heated beyond the boiling point of the fluid and the fluid may undergo a phase change (i.e., vaporize). Accordingly, vaporized working fluid 20' may flow in the housing 22 between the evaporator 12 to the opposite end of the housing 22, referred to as a condenser 14. The portion of the housing 22 between the evaporator 12 and condenser 14 may be referred to as the adiabatic section 16' and may generally correspond to the pipe 16 shown in FIG. 1. That is, the adiabatic section 16' and the pipe 16 may both facilitate mass transfer of the working fluid 20 between the evaporator 12 and condenser 14. At the condenser 14, the vaporized working fluid 20' may transfer heat 32 from the vaporized working fluid 20' to the housing 22 such that the heat 32 is in turn dissipated from the condenser 14 (e.g., by way of convection, conduction, and/or radiation). As a result, the vaporized working fluid 20' may condense to liquid working fluid 20. As such, the liquid working fluid 20 may return to the evaporator portion 12 of the housing 22 (e.g., by way of adiabatic section 16'). In this regard, the condensed liquid working fluid 20 may again be disposed at the evaporator 12 and the cycle may repeat.

While referred to as the adiabatic section 16', it will be appreciated that in the heat pipe 10 depicted in FIG. 2, the flow of the vaporized working fluid 20' from the evaporator 12 to the condenser 14 and the flow of liquid working fluid 20 fluid from the condenser 14 to the evaporator 12 in the adiabatic section 16' may pass generally through the same volume such that some amount of heat transfer occurs. This is also the case in the pipe 16 of the heat pipes 10 depicted in FIG. 1. In this regard, the fluid flow of vaporized working fluid 20' and condensed liquid working fluid 20 may be integrated and not distinct. While it may be that liquid working fluid 20 may generally travel along the sidewall of the housing 22, while vaporized working fluid 20' may travel from the evaporator 12 to the condenser 14 openly along a central volume spaced away from the sidewall of the housing 22, the different phases of the working fluid 20 and 20' may pass one another as each move within the housing 22. In this regard, the condensed liquid working fluid 20 may be pre-heated by the vaporized working fluid 20' and the vaporized working fluid 20' may begin to be cooled by the liquid working fluid 20 prior to reaching the condenser 14. As such, the flow of working fluid 20 and 20' through the adiabatic section 16' may in fact not be adiabatic, but rather heat transfer between the vaporized working fluid 20' and the liquid working fluid 20 may occur. Accordingly, the heat pipe 10 may experience reduced efficiencies.

Figure 3:
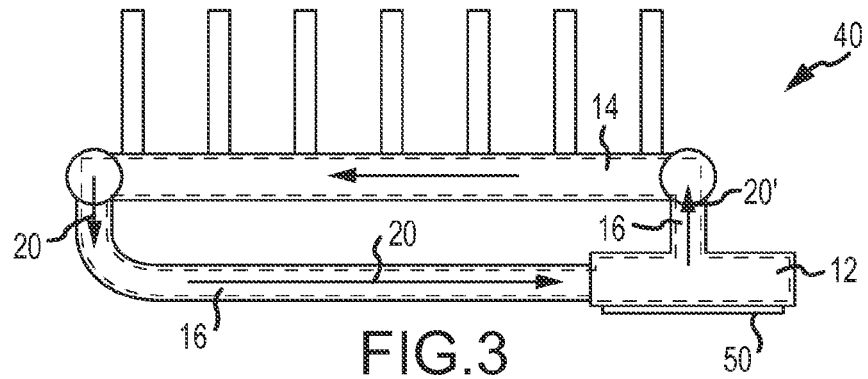
FIG. 3 depicts an example of a loop heat pipe.

A loop heat pipe 40 is generally depicted in FIG. 3. In a loop heat pipe 40, separate paths for fluid communication between the evaporator 12 and the condenser 14 are provided to facilitate flow of vaporized working fluid 20' from the evaporator 12 to the condenser 14 and of liquid working fluid 20 from the condenser 14 to the evaporator 12. However, it will be appreciated that the loop heat pipe 40 includes additional pipes 16 to facilitate the separate fluid paths for the vaporized working fluid 20' and liquid working fluid 20. As described above, the additional pipes 16 may introduce undesirable failure modalities (e.g., leaks, ruptures, etc.) that adversely affect the reliability of the heat pipe 40. As such, the additional pipes 16 of the loop heat pipe 40 shown in FIG. 3 may result in reliability issues that may negatively affect the performance of the loop heat pipe 40.

Figure 4A:
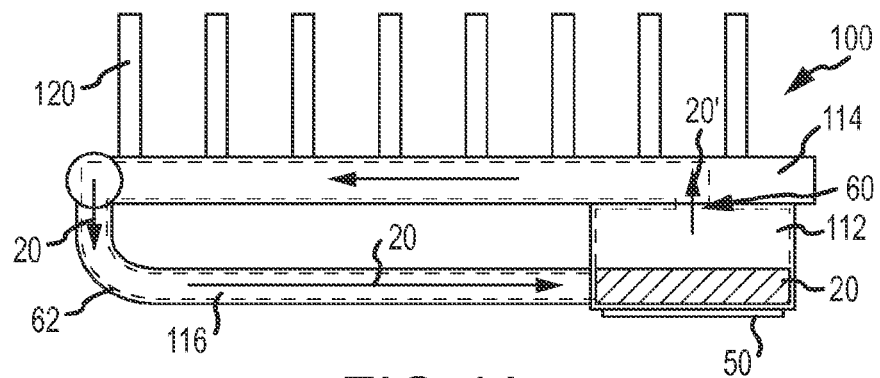
FIGS. 4A and 4B depict embodiments of integrated heat transfer systems.
Figure 4B:
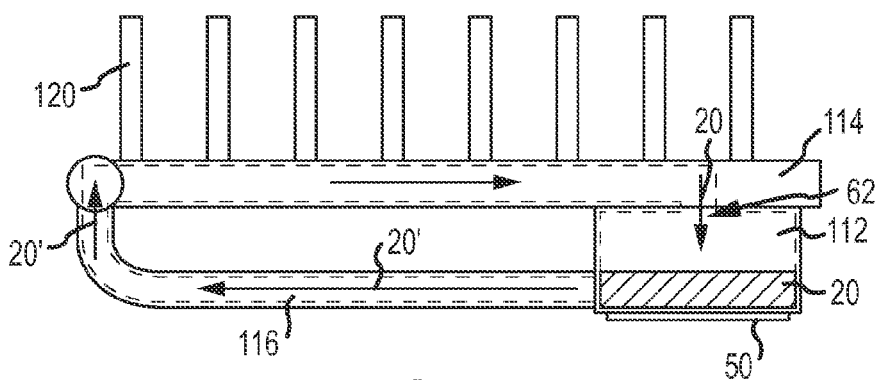

Embodiments of heat transfer systems 100 with integrated fluid passages are depicted in FIG. 4A and FIG. 4B. By virtue of the integrated passages, separate fluid passages may be established while eliminating the reliability concerns associated with additional pipes 16. The heat transfer system 100 generally includes an evaporator 112 that may be in thermal communication with a heat source 50. In various embodiments, the heat source 50 may be an electronic component such as a microprocessor, a memory, an LED array, a resistor, a transistor, or other electronic component capable of producing heat during operation.

In the embodiment depicted in FIG. 4A, the evaporator 112 may be in direct fluid communication with the condenser 114. In this regard, a first integral fluid path 60 may be established between the evaporator 112 and the condenser 114 to facilitate flow of vaporized working fluid 20' from the evaporator 112 to the condenser 114. The vaporized working fluid 20' may flow through the condenser 114 and transfer heat thereto. Heat may be dissipated from the condenser 114. For example, fins, fans, or other devices 120 may be provided to increase convective, radiant, or conductive heat transfer from the condenser 114. In any regard, the vaporized working fluid 20' may condense in the condenser 114.

As depicted in FIG. 4A, a second fluid transfer path 62 for return of liquid working fluid 20 from the condenser 114 to the evaporator 112 may be provided through a duct 116. In this regard, liquid working fluid 20 may return to the evaporator 112 by way of the duct 116 extending from the condenser 114 to the evaporator 112. As such, the system 100 of FIG. 4A may experience increased efficiencies over a heat pipe 10 by providing dedicated fluid transfer paths for the flow of vaporized working fluid 20' and liquid working fluid 20, respectively, without the need for pipes 16 to be provided for both vaporized working fluid 20' and liquid working fluid 20 flow as is necessary for traditional loop heat pipes 40.

Furthermore, while it is depicted in FIG. 4A that the evaporator 112 is in direct fluid communication with the condenser 114 to establish the first integral fluid transfer path 60 for vaporized working fluid 20', it may be appreciated that an integral flow transfer path may alternatively provided as depicted in FIG. 4B such that the second fluid transfer path 62 is integrally provided by the evaporator 112 and condenser 114 to facilitate direct fluid communication of liquid working fluid 20' from the condenser 114 to the evaporator 112. As such, the flow of vaporized working fluid 20 from the evaporator to the condenser may be provided by way of a first fluid path 60 defined by the duct 116 between the evaporator 112 and the condenser 114. In this regard, it will be appreciated that either of the first fluid transfer path 60 or the second fluid transfer path 62 may be integrally provided by the evaporator 112 and/or condenser 114.

Figure 5:
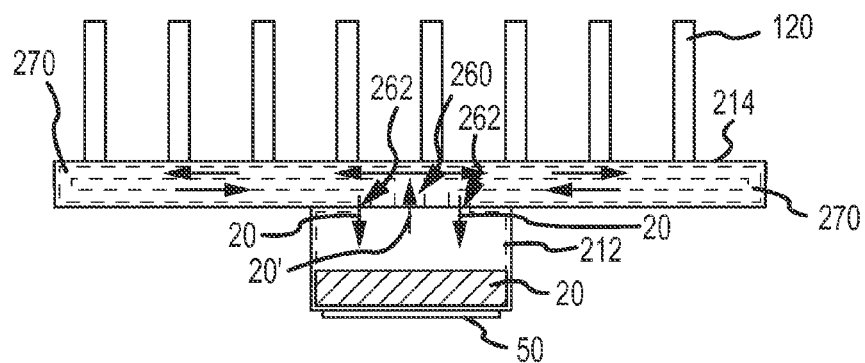
FIG. 5 depicts another embodiment of an integrated heat transfer system.

FIG. 5 depicts another embodiment of a heat transfer system 200. The heat transfer system 200 of FIG. 5 may include an evaporator 212 that is in direct fluid communication with the condenser 214 such that separate, integrated fluid transfer paths 260 and 262 are provided in the evaporator 212 and/or condenser 214 for both the flow of vaporized working fluid 20' from the evaporator 212 to the condenser 214 via a first fluid transfer path 260 and for liquid working fluid 20 to flow from the condenser 214 to the evaporator 212 via a second fluid transfer path 262. That is, in the embodiment depicted in FIG. 5, both the first fluid transfer path 260 and the second fluid transfer path 262 are integrated into the evaporator 212 and condenser 214 such that no external duct 116 or other pipes 16 are present. In this regard, the failure modalities associated with the duct 116 or pipes 16 may be eliminated and the reliability of the heat transfer system 200 may be improved.

Figure 6:
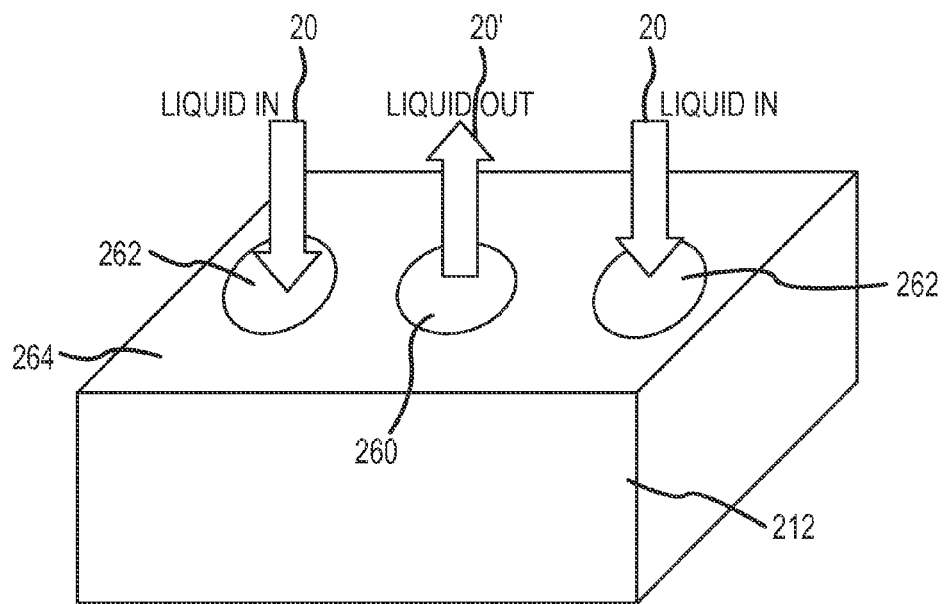
FIG. 6 depicts an interface between an evaporator and a condenser of the integrated heat transfer system of FIG. 5.

With further reference to FIG. 6, a detailed view of an interface 264 between the evaporator 212 and condenser 214 is shown. The condenser 214 is not depicted in FIG. 6 for purposes of clarity. However, the interface 264 may be in contact with the condenser 214. In this regard, the condenser 214 may include or partially define corresponding fluid transfer paths 260 and 262 that establish fluid communication with the evaporator 212 at the portions of first fluid transfer path 260 and the second fluid transfer path 262 depicted. As such, vaporized working fluid 20' may flow from the evaporator 212 to the condenser 214 by way of the first fluid transfer path 260. Additionally, liquid working fluid 20 may return to the condenser by way of a second fluid transfer path 262. As can be appreciated in FIG. 5 and FIG. 6, more than one passage between the condenser 214 and the evaporator 212 may comprise the second fluid transfer path 262. Additional or fewer passages may also comprise the second fluid transfer path 262. In a similar regard, while a single passage is shown as comprising the first fluid transfer path 260, additional passages may be provided to define the first fluid transfer path 260 without limitation.

Figure 7:
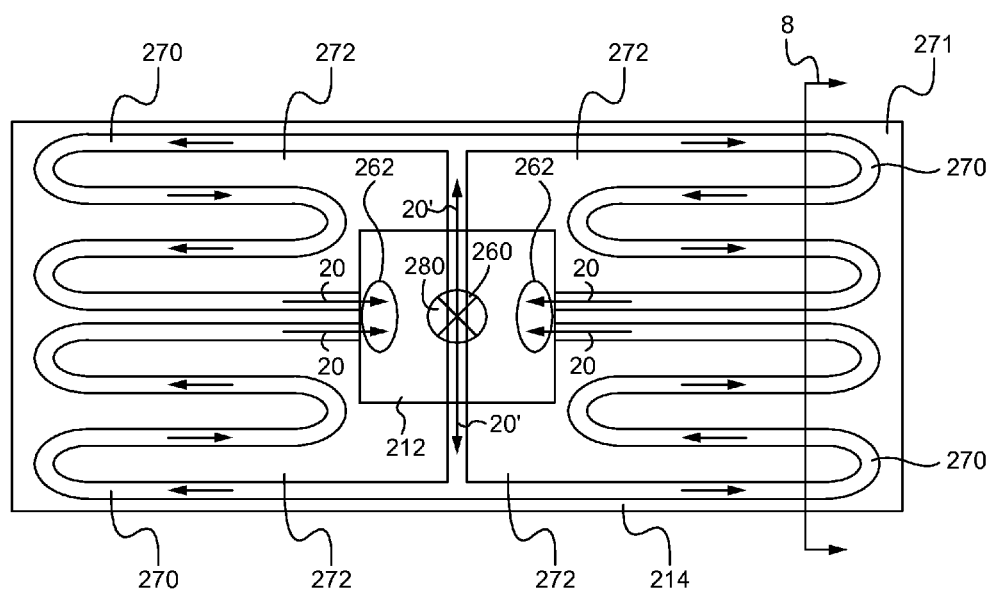
FIG. 7 depicts one embodiment of fluid transfer paths of the heat transfer system of FIG. 5.
Figure 8:
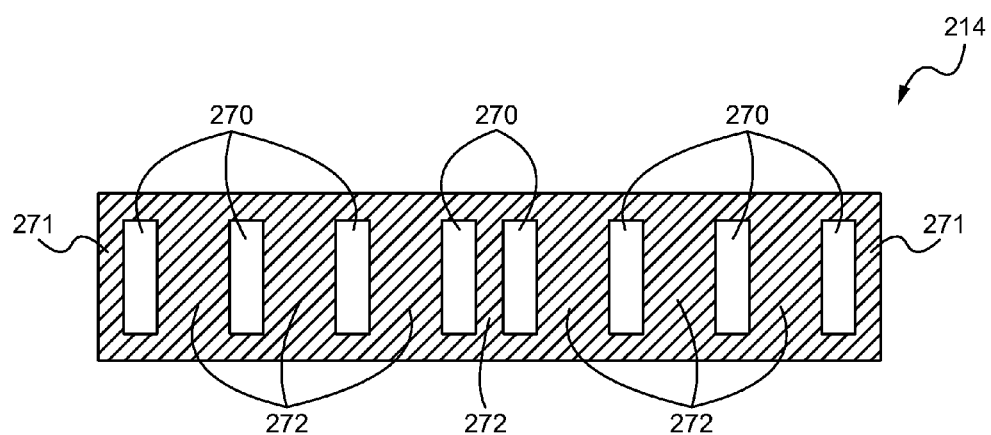
FIG. 8 depicts one embodiment of a cross sectional view of the condenser of FIG. 7.

With further reference to FIG. 7, a fluid passage 270 may be provided that extends between the first fluid transfer path 260 and the second fluid transfer path 262. In this regard, the fluid passage 270 may pass through the condenser 214. In one embodiment, the fluid passage 270 may be completely defined by and integrated with the condenser 214. In other words, the fluid passage 270 is able to be defined by the perimeter walls 271 and the internal walls 272 of the condenser 214 that surround the fluid passage 207. FIG. 8 illustrates a cross sectional view of the condenser 214 at the line 8 shown in FIG. 7. In any regard, as the vaporized working fluid 20 passes through the fluid passage 270 the vaporized working fluid 20 may transfer heat to the condenser 214 that is in turn dissipated from the condenser 214. In this regard, the vaporized working fluid 20 may condense as it passes through the fluid passage 270 such that condensed, liquid working fluid 20 returns to the evaporator 212 via the second fluid passage 262.

As may particularly be appreciated in FIG. 7, the fluid passage 270 may extend beyond the lateral spatial extent of the evaporator 212. That is, the evaporator 212 may extend laterally such that the evaporator 212 occupies a footprint as depicted in FIG. 7. The condenser 214, having the fluid passage 270 extending therethrough, may extend beyond the extent of the footprint of the evaporator 212. In turn, the mass flow of the working fluid 20 and/or 20' as it passes through the fluid passage 270 may extend beyond the lateral spatial extent of the evaporator 212. This may assist in dissipating heat from the vaporized working fluid 20' and/or liquid working fluid 20 as it passes through the fluid passage 270. For example, the internal surface area of the fluid passage 270 may provide for heat transfer from the vaporized working fluid 20' to the condenser 214 such that the heat may be dissipated. The internal surface area of the fluid passage 270 may be greater than an internal surface area of the evaporator 212. For example, the surface area of the fluid passage 270 may be at least twice as large as the internal surface area of the evaporator 212. In this regard, the condenser 214 and/or fluid passage 270 may be sized such that for a given heat source 50, the amount of heat transferred by the vaporized working fluid 20' to the condenser 214 may be sufficient to maintain the heat source 50 at desired operating temperature without the heat source 50 overheating.

The mass transfer of the working fluid 20, 20' through the heat transfer system 200 may be driven by the heat imparted to the system 200 by the heat source 50. That is, the transfer of vaporized working fluid 20' to the condenser 214 from the evaporator 212 may be driven by the heating of the working fluid 20, 20'. That is, convection currents or similar mechanisms may be generated within the system 200 that result in flow of vaporized working fluid 20' and liquid working fluid 20 as described above. Alternatively, other mechanisms may result in movement of working fluid 20, 20' through the system 200 such as, for example, gravity, capillary forces, etc.

Furthermore, one or more flow control devices 280 may be provided in the system 200 to direct flow of liquid working fluid 20 and/or vaporized working fluid 20' from the first fluid transfer path 260, through the fluid passage 270, and through the second fluid transfer path 262, in that order. This progression of flow may be referred to as an operational fluid flow and may represent normal operation of the heat transfer system 200 the manner described above. For example, as shown in FIG. 7, a flow control 280 is shown at the first fluid transfer path 260. The flow control 280 may comprise, for example, a check valve, a non-return valve, a one-way valve, or other mechanism that allows flow of fluid in a single direction. In various embodiments, the flow control 280 may comprise, for example, a ball check valve, a diaphragm check valve, a stop-check valve, a reed valve, or any other appropriate mechanism. Furthermore, while a single flow control 280 is depicted in FIG. 7, it will be understood that additional flow controls 280 may be provided (e.g., at the second fluid transfer path 262 or along the fluid passage 270) without limitation. In any regard, flow of the fluid in a direction opposite the operational fluid flow may be limited or reduced by the flow control 280.

In various embodiments, the working fluid 20 may comprise one or more of water, alcohol, ammonia, a refrigerant, or other substance with an appropriate phase change temperature. For example, the working fluid 20 may be selected at least in part based on the phase change temperature of the working fluid and the desired operating temperature of the heat source 50. For example, a working fluid 20 with a phase change temperature much lower than an operating temperature of the heat source 50 may result in vaporization of all the working fluid 20 in the heat transfer system. A phase change temperature of the working fluid 20 higher than the operating temperature of the heat source 50 may not result in vaporization of any of the working fluid 20. Accordingly, a working fluid 20 with a phase change temperature lower than the operating temperature of the heat source 50 such that a portion, but not all of the working fluid 20, is vaporized may be selected for proper operation of the heat transfer system.

In one embodiment, the evaporator 212 and the condenser 214 may be integrally constructed from a single piece of material. In this regard, the evaporator 212 may comprise a portion of the integral piece of material and the condenser 214 may comprise a portion of the integral piece of material. The material may be, for example, aluminum, copper, gold, bronze, combinations thereof, or any other material that facilitates heat transfer through the material. Alternatively, the evaporator 212 and condenser 214 may be constructed from different portions of material. In various embodiments, the different portions of material may be different materials entirely or may be constructed from different portions comprising the same material.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed is:

1. A heat transfer system, comprising:
    an evaporator thermally engageable with a heat source and including an evaporator cavity holding a working fluid;
    a condenser having a ceiling, a floor, one or more perimeter walls extending between the ceiling and the floor at the perimeter of the ceiling and the floor, one or more internal walls extending between the ceiling and the floor inside the perimeter walls, and a continuous condenser cavity between the ceiling, the floor, the perimeter walls and the internal walls, wherein the continuous condenser cavity is in fluid communication with the evaporator to receive vaporized working fluid from the evaporator, wherein the evaporator and the condenser are adjacent to each other such that a thin wall forms at least a portion of both the top surface of the evaporator cavity and the bottom surface of the continuous condenser cavity;
    a first fluid transfer path extending from the evaporator to the condenser for movement of the vaporized working fluid from the evaporator to the condenser; and
    a second fluid transfer path extending from the condenser to the evaporator for movement of condensed working fluid from the condenser to the evaporator, wherein the second fluid transfer path is separate from the first fluid transfer path;

wherein at least one of the first fluid transfer path or the second fluid transfer path is integrally defined by the evaporator or condenser, and further wherein the continuous condenser cavity extends laterally beyond the perimeter of the evaporator cavity, wherein the evaporator is sealed such that the working fluid is only able to exit the evaporator by entering the condenser.

2. The heat transfer system according to claim 1, wherein the evaporator is in direct fluid communication with the condenser via the first fluid transfer path integrally defined by at least one of the evaporator or the condenser.

3. The heat transfer system according to claim 2, wherein the condenser is in direct fluid communication with the evaporator via the second fluid transfer path integrally defined by at least one of the condenser and the evaporator.

4. The heat transfer system according to claim 1, further comprising:
an electronic component in thermal communication with the evaporator, wherein the electronic component generates heat in response to operation of the electronic component and comprises the heat source.

5. The heat transfer system according to claim 4, further comprising a fluid passage extending between the first fluid transfer path and the second fluid transfer path, wherein the fluid passage extends through the condenser.

6. The heat transfer system according to claim 5, wherein the fluid passage extends laterally beyond a lateral spatial extent of the evaporator.

7. The heat transfer system according to claim 6, wherein flow of the working fluid through the fluid passage comprises mass flow of the working fluid laterally beyond the lateral spatial extent of the evaporator.

8. The heat transfer system according to claim 6, wherein an internal surface area of the condenser is at least about twice as large as an internal surface area of the evaporator.

9. The heat transfer system according to claim 8, wherein a flow control establishes operational fluid flow of the working fluid from the first fluid transfer path, through the fluid passage, and to the second fluid transfer path.

10. The heat transfer system according to claim 9, wherein flow in a direction opposite the operational fluid flow is limited by the flow control.

11. The heat transfer system according to claim 4, wherein the working fluid comprises at least one of water, alcohol, or ammonia.

12. The heat transfer system according to claim 11, wherein the evaporator and the condenser are integrally constructed from a single portion of material.

13. The heat transfer system according to claim 12, wherein the material comprises aluminum or copper.

14. A system for cooling an electronic device, the electronic device operable to generate heat upon operation of the electronic device, the system comprising:

an evaporator provided in thermal communication with the electronic device, wherein the evaporator includes an evaporator cavity holding working fluid operable to absorb thermal energy transferred thereto from the electronic device;

a condenser having a ceiling, a floor, one or more perimeter walls extending between the ceiling and the floor at the perimeter of the ceiling and the floor, one or more internal walls extending between the ceiling and the floor inside the perimeter walls, and a continuous condenser cavity between the ceiling, the floor, the perimeter walls and the internal walls, wherein the continuous condenser cavity is in fluid communication with the evaporator and operable to receive vaporized working fluid from the evaporator, wherein the working fluid is vaporized as a result of the absorbing of thermal energy from the electronic device, wherein the evaporator and the condenser are adjacent to each other such that a thin wall forms at least a portion of both the top surface of the evaporator cavity and the bottom surface of the continuous condenser cavity, wherein the entirety of the continuous condenser cavity is located on a level above the bottom surface;

a first fluid transfer path extending from the evaporator to the condenser for movement of the vaporized working fluid from the evaporator to the condenser; and a plurality of second fluid transfer paths each extending from the condenser to the evaporator for movement of condensed working fluid from the condenser to the evaporator, wherein the working fluid is condensed as a result of transfer of thermal energy from the working fluid to the condenser, and wherein the first fluid transfer path is separate from the second fluid transfer paths;

wherein at least one of the first fluid transfer path and the second fluid transfer path is integrally defined by the evaporator or condenser and the electronic device is outside of the evaporator cavity, and further wherein the continuous condenser cavity extends laterally beyond the perimeter of the evaporator cavity, wherein the evaporator is sealed such that the working fluid is only able to exit the evaporator by entering the condenser.

15. The system according to claim 14, further comprising a fluid passage extending between the first fluid transfer path and the second fluid transfer path, wherein the fluid passage at least in part extends laterally beyond a lateral spatial extent of the evaporator.

16. The system according to claim 15, further comprising a flow control for directing working fluid from the first fluid transfer path, through the fluid passage, and to the second fluid transfer path in that order.

* * * * *